United States Patent [19]

Shiobara et al.

[11] Patent Number: 5,248,710
[45] Date of Patent: Sep. 28, 1993

[54] FLIP CHIP ENCAPSULATING COMPOSITIONS AND SEMICONDUCTOR DEVICES ENCAPSULATED THEREWITH

[75] Inventors: Toshio Shiobara; Koji Futatsumori; Shinichi Jingu, all of Annaka, Japan

[73] Assignee: Shin-Etsu Chemical Co., Ltd., Tokyo, Japan

[21] Appl. No.: 889,369

[22] Filed: May 28, 1992

[30] Foreign Application Priority Data

May 29, 1991 [JP] Japan .................. 3-153943

[51] Int. Cl.⁵ .............................................. C08L 63/02
[52] U.S. Cl. ................................... 523/435; 528/21; 528/27
[58] Field of Search .................. 523/435; 528/21, 27

[56] References Cited

U.S. PATENT DOCUMENTS 5,053,445 10/1991 Itoh et al. .................. 523/435
5,096,762 3/1992 Yoshida et al. .................. 428/76

Primary Examiner—Melvyn I. Marquis
Assistant Examiner—D. Aylward
Attorney, Agent, or Firm—Birch, Stewart, Kolasch & Birch

[57] ABSTRACT

A composition comprising (A) an epoxy resin having at least two epoxy groups in a molecule, (B) a silicone-modified epoxy resin, (C) an imidazole curing agent having a solubility of up to 0.1% by weight in epoxy resin (A) at 25° C., and (D) fused silica having a mean particle size of up to 10 μm and adjusted to a viscosity of up to about 4,000 poise at 25° C. satisfies the requirements for flip chip encapsulation since the composition has improved shelf stability and filling ability and cures into products having improved moisture resistance. Semiconductor devices encapsulated with cured products of the composition remain reliable because of moisture resistance.

7 Claims, No Drawings

FLIP CHIP ENCAPSULATING COMPOSITIONS AND SEMICONDUCTOR DEVICES ENCAPSULATED THEREWITH

This invention relates to flip chip encapsulating compositions having improved shelf stability and filling ability and curing into products having improved moisture resistance. It also relates to semiconductor devices encapsulated with cured products of the compositions.

BACKGROUND OF THE INVENTION

Liquid epoxy resins and liquid epoxy resin compositions having inorganic fillers blended in liquid epoxy resins are often employed as encapsulants for flip chips since they are improved in moldability, adherence, electrical and mechanical properties over other conventional thermosetting resins. Such epoxy resin compositions are commercially available in two forms, two part type in which a base resin part and a curing agent part are kept separate and mixed immediately before use and one part type comprising a uniform premix of a base resin and a curing agent. The one part type has been a mainstream in the art since it is easier to use. Prior art one part type epoxy resin compositions formulated as flip chip encapsulants generally use acid anhydrides as the curing agent since the Q compositions must be shelf stable for a long time from their preparation until use. One part type epoxy resin compositions using curing agents other than acid anhydrides are less stable during storage.

Epoxy resin compositions incorporating acid anhydrides, however, have several drawbacks. The compositions tend to absorb moisture which causes the compositions to expand in volume, adversely affecting flip chip characteristics, especially the resistance at the solder bump-lead interface. Thermal changes during curing and thermal changes in the service environment also increase the resistance at the solder bump-lead interface. Although flip chip encapsulation requires that the encapsulant fill in spaces as narrow as about 20 to 100 μm, the compositions are too viscous or thixotropic to achieve complete filling.

Therefore, an object of the present invention is to provide a flip chip encapsulating composition of the one part type having improved shelf stability and filling ability and curing into products having improved moisture resistance. Another object of the present invention is to provide a semiconductor device encapsulated therewith.

SUMMARY OF THE INVENTION

According to the present invention, there is provided a flip chip encapsulating composition comprising (A) an epoxy resin having at least two epoxy groups in a molecule. The composition has blended therein (B) a silicone-modified epoxy resin as a stress reducing agent. The silicone-modified epoxy resin is an alkenyl-containing epoxy resin which is modified with an organic silicon compound of formula (1):

wherein R is a substituted or unsubstituted monovalent hydrocarbon group or an alkoxy group, letters a and b are numbers meeting $0.01 \leq a \leq 1$ and $1 \leq b \leq 3$, in which the number of silicon atoms in a molecule is an integer of from 20 to 400, and the number of hydrogen atoms directly attached to silicon atoms is an integer of at least 1, by adding a ≡SiH group of the organic silicon compound to an alkenyl group of the epoxy resin. Also, (C) an imidazole compound having a solubility of up to 0.1% by weight in epoxy resin (A) at 25° C. is blended as a curing agent for these epoxy resins, and (D) fused silica having a mean particle size of up to 10 μm and containing up to 0.5% by weight of coarse particles having a particle size of at least 30 μm is blended as an inorganic filler. The composition should have a viscosity of up to 4,000 poise at 25° C. The resulting one part type composition is shelf stable, fills in narrow spaces and cures into products having improved moisture resistance. Therefore, the composition is a useful flip chip encapsulating composition. Also contemplated herein is a semiconductor device encapsulated with a cured product of the composition.

DETAILED DESCRIPTION OF THE INVENTION

As mentioned above, the flip chip encapsulating composition of the invention includes (A) an epoxy resin, (B) a silicone-modified epoxy resin, (C) an imidazole, and (C) fused silica as essential components.

Component (A) is an epoxy resin having at least two epoxy groups in a molecule. No particular limit is imposed on the molecular structure and molecular weight of the epoxy resin insofar as it can be cured with the curing agent to be described later. Any desired one of conventional well-known epoxy resins may be used. Exemplary are epoxy resins synthesized from epichlorohydrin and bisphenols or other novolak resins, cycloaliphatic epoxy resins, and epoxy resins having incorporated therein halogen atoms such as chlorine and bromine atoms. In order to formulate a composition which is liquid at room temperature, bisphenol type epoxy resins including glycidyl ether derivatives of bisphenol-A or bisphenol-F are advantageously used, preferably having a viscosity of up to 500 poise at 25° C. The epoxy resins may be used alone or in admixture of two or more.

If desired, a monoepoxy compound may be used in combination with the aforementioned epoxy resin. Examples of the monoepoxy compound include styrene oxide, cyclohexene oxide, propylene oxide, methyl glycidyl ether, ethyl glycidyl ether, phenyl glycidyl ether, allyl glycidyl ether, octylene oxide, and dodecene oxide.

Component (B) in the flip chip encapsulating composition of the invention is a silicone-modified epoxy resin which is effective for reducing stresses. The silicone-modified epoxy resin is an alkenyl-containing epoxy resin which is modified by adding a ≡SiH group of an organic silicon compound of formula (1) to an alkenyl group thereof.

In formula (1), R is a substituted or unsubstituted monovalent hydrocarbon group having 1 to 10 carbon atoms, preferably 1 to 8 carbon atoms or an alkoxy group having 1 to 6 carbon atoms, preferably 1 to 4 carbon atoms, letters a and b are numbers meeting $0.01 \leq a \leq 1$ and $1 \leq b \leq 3$. The number of silicon atoms in a molecule is an integer of from 20 to 400, and the number of hydrogen atoms directly attached to silicon atoms is an integer of at least 1.

The alkenyl group-containing epoxy resin may be obtained, for example, by epoxidizing an alkenyl group-containing phenolic resin with epichlorohydrin, or by partially reacting a conventional well-known epoxy resin with 2-allylphenol, etc. Illustrative examples of the alkenyl group-containing epoxy resin are given below as compounds of formulae (2) to (4) wherein p and q are generally integers within the range: $1 \leq p \leq 10$ and $1 \leq q \leq 3$.

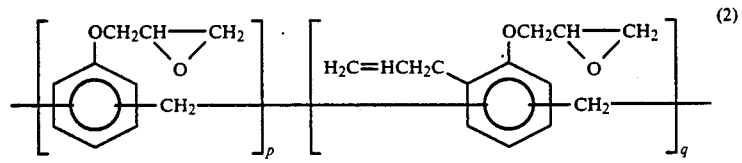
(2)

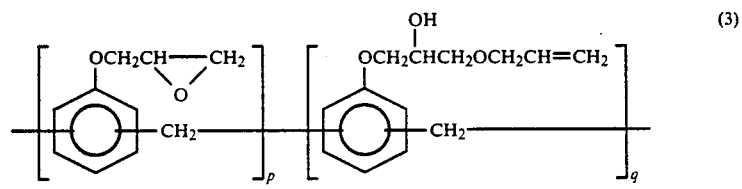
(3)

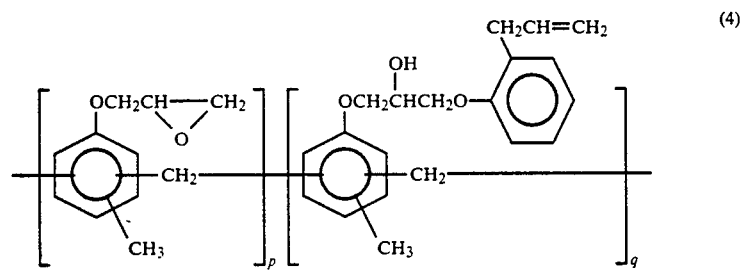
(4)

The organopolysiloxane of formula (1) should have at least one $\equiv$SiH group in a molecule. Preferred are both hydrogen-terminated methylpolysiloxane, both hydrogenterminated methylphenylpolysiloxane, and both hydrogenterminated methyl(2-trimethoxysilylethyl)polysiloxane.

Illustrative, non-limiting examples of the organopolysiloxane of formula (1) are given below as compounds of formulae (5) to (9).

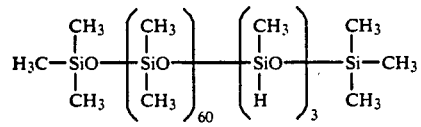
(5)

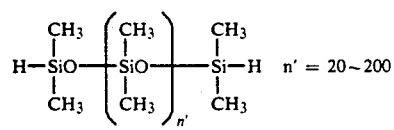
(6)

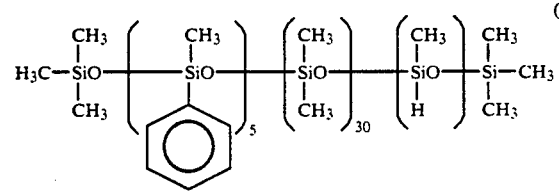
(7)

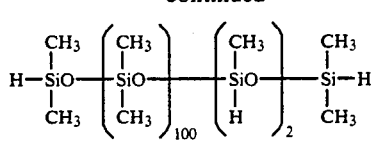
(8)

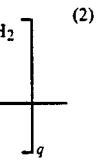
(9)

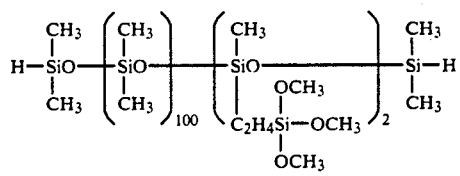

The organopolysiloxanes of formula (1) preferably have a degree of polymerization of from 20 to 400, more preferably from 30 to 200. With organopolysiloxanes having a degree of polymerization of less than 20, the resulting composition would sometimes become less flexible and low in Tg. It is technically very difficult to synthesize organopolysiloxanes having a degree of polymerization of more than 400, and if possible, copolymers of such organopolysiloxanes are difficult to disperse in the epoxy resin composition. In general, organopolysiloxanes having a fixed silicone content tend to increase crack resistance and Tg, but lower dispersibility and adhesion to elements as the degree of polymerization increases. Dispersibility and adhesion to elements can be improved by introducing a modifying group as given below into side chains as represented by formula (9).

—$C_2H_4Si(OCH_3)_3$, —$CH_2$—$CH_2COOCH_3Si(OCH_3)_3$,

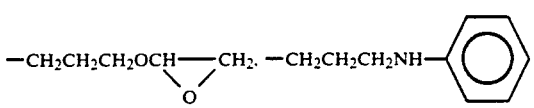

The silicone-modified epoxy resin or copolymer to be blended in the composition of the invention can be obtained by reacting an alkenyl group-containing epoxy resin with an organopolysiloxane having a ≡SiH group of formula (1) at elevated temperatures in the presence of a well-known addition catalyst, for example, platinum catalyst, typically chloroplatinic acid.

The silicone-modified epoxy resin (B) is preferably blended in amounts of 0.5 to about 60 parts, more preferably from about 2 to about 50 parts by weight per 100 parts by weight of the epoxy resin (A). Less than 0.5 parts of component (B) would be ineffective for reducing stresses whereas compositions containing more than 60 parts of of component (B) would be low in mechanical strength.

Component (C) is an imidazole compound which is a curing agent for the epoxy resins. The imidazole should have a solubility of up to 0.1% by weight in epoxy resin (A) at 25° C. This limited solubility means that at 25° C. or lower temperatures, the imidazole is substantially insoluble in the epoxy resin and therefore, does not act as a curing agent, allowing the composition to be stable during shelf storage.

In general, imidazoles having a high melting point are useful. Exemplary are 2-phenyl 4,5-dihydroxymethylimidazole, 2-phenyl-4-methyl-5-hydroxymethylimidazole, 2,4-diamino-6[2'-undecylimidazolyl-(1)']ethyl-S-triazine, and 2-phenyl-4-benzyl-5-hydroxymethylimidazole. Imidazoles are generally available in micro-capsule form having a mixture of imidazoles sealed therein. Commercially available micro capsules are HX-3721 and HX-3741 manufactured and sold by Asahi Chemicals K.K.

Component (C) is preferably blended in an amount of about 0.5 to 20 parts, more preferably about 2 to 10 parts by weight per 100 parts by weight of epoxy resin (A). Less than 0.5 parts of imidazole would be ineffective for curing purpose whereas more than 20 parts of imidazole would render the composition too viscous.

Component (D) is fused silica which is effective for reducing the coefficient of expansion of the present composition in cured form. Particulate fused silica should have a mean particle size of 0.5 to 10 μm and the content of coarse particles having a particle size of 30 μm or larger should be up to 0.5% by weight of the entire silica. Outside the ranges, the composition is difficult to completely fill in spaces between a flip chip and a substrate, failing to attain the objects of the invention. No other requirements are imposed on the fused silica. One or more species of fused silica may be used although a mixture of two fused silica species having different mean particle sizes is useful in reducing the viscosity of the associated composition.

Fused silica is preferably blended in an amount of about 30 to about 300 parts, more preferably about 100 to 200 parts by weight per 100 parts by weight of components (A) to (C).

If desired, the composition of the invention may further contain various well-known additives depending on its purpose and application. Exemplary additives include adhesion modifying carbon functional silanes, pigments such as carbon black, dyes, anti-oxidants, surface treating agents (e.g., glycidoxypropyltrimethoxysilane), reactive diluents, and solvents.

The flip chip encapsulating composition of the invention may be prepared by blending predetermined amounts of the necessary components and mixing them uniformly. The composition should have a viscosity of up to 4,000 poise at 25° C., preferably 100 to 2,000 poise at 25° C. Compositions having higher viscosity cannot provide satisfactory filling for flip chips.

Flip chips are encapsulated with the compositions of the present invention using conventional well-known molding techniques including transfer molding, injection molding, and casting, with the casting techniques being preferred. Most often, the compositions are molded at a temperature of about 80 to about 180° C. for about 30 minutes to about 8 hours.

EXAMPLE

Examples of the present invention are given below together with comparative examples, by way of illustration and not by way of limitation. All parts are by weight.

First, the synthesis of silicone-modified epoxy resins is described.

SYNTHESIS EXAMPLE

A 1-liter, four-necked flask equipped with a reflux condenser, thermometer, stirrer, and dropping funnel was charged with 300 grams of an epoxidized phenol novolak resin having a softening point of 80° C. and an epoxy equivalent of 195. With stirring at a temperature of 110° C., a mixture of 32 grams of 2-allylphenol and 1 gram of tributylamine was added dropwise to the flask over 10 minutes. Stirring was continued for a further 2 hours at 110° C. The unreacted 2-allylphenol and tributylamine were distilled off in vacuum from the reaction mixture, yielding an allyl-containing epoxy resin having an allyl equivalent of 1490 and an epoxy equivalent of 235.

Next, a similar four-necked flask was charged with 120 grams of the allyl-containing epoxy resin prepared above, 100 grams of methyl isobutyl ketone, 200 grams of toluene, and 0.04 grams of a 2-ethylhexanol modified chloroplatinic acid solution having a platinum concentration of 2% by weight. After azeotropic dewatering for 1 hour, 80 grams of the organopolysiloxane shown in Table 1 was added dropwise to the flask over 30 minutes at the reflux temperature. Reaction was carried out by continuing agitation for a further 4 hours at the same temperature. The reaction mixture was washed with water and the solvent was distilled off in vacuum, yielding a crude reaction product.

The crude reaction product, 100 grams, was dissolved in 380 grams of acetone. The solution was combined with 140 grams of water and then allowed to stand until it separated into two layers. After the upper layer was decanted off, the solution was again mixed with 200 grams of acetone, combined with 50 grams of water, and allowed to stand until two layers separated. The lower layer was collected and removed of acetone and water by vacuum distillation, yielding an end silicone-modified epoxy resin as shown in Table 1.

TABLE 1

|  | Silicone-modified epoxy resin I | Silicone-modified epoxy resin II |
|---|---|---|
| Starting organopolysiloxane | $H-\left[\begin{array}{c}Me\\|\\SiO\\|\\Me\end{array}\right]_{30}\begin{array}{c}Me\\|\\Si-H\\|\\Me\end{array}$ | $H-\left[\begin{array}{c}Me\\|\\SiO\\|\\Me\end{array}\right]_{100}\begin{array}{c}Me\\|\\Si-H\\|\\Me\end{array}$ |
| Appearance | pale yellow transparent solid | whitish yellow opaque solid |

TABLE 1-continued

|  | Silicone-modified epoxy resin I | Silicone-modified epoxy resin II |
|---|---|---|
| Melt viscosity (cp @ 150° C.) | 650 | 760 |
| Heat loss (% @ 150° C./1 hr.) | 0.42 | 0.56 |

EXAMPLES 1-3 AND COMPARATIVE EXAMPLES 1-5

Eight epoxy resin compositions were prepared by uniformly blending an epoxidized bisphenol-A (trade name Epikote 828, Yuka Shell K.K.), silicone-modified epoxy resin I or II prepared in Synthesis Example, curing agent shown in Table 2, fused silica shown in Table 3, phenyl glycidyl ether, DBU benzyl tetraphenylborate (trade name Ucat 5002, Sunapro K.K.), and γ-glycidoxytrimethoxysilane in the proportion shown in Table 4.

TABLE 2

| No. | Type | Curing agent Compound | Solubility in Epikote 828 (%) |
|---|---|---|---|
| I | Imidazole | 2-phenyl-4-methyl-5-hydroxymethylimidazole, trade name 2P4MHZ, Shikoku Chemicals K.K. | <0.01 |
| II | Imidazole | imidazole micro-capsule, trade name HX 3721, Asahi Chemicals K.K. | <0.01 |
| III | Imidazole | 2-phenylimidazole, trade name 2PZ, Shikoku Chemicals K.K. | >1.0 |
| IV | Acid anhydride | 4-methylhexahydrophthalic anhydride, trade name MH700, Shin-Nihon Rika K.K. | >100 |

TABLE 3

| No. | Fused silica Mean particle size (μm) | Coarse particles of 30 μm or larger (%) |
|---|---|---|
| I | 5.5 | <0.1 |
| II | 0.6 | <0.1 |
| III | 10.3 | 14.6 |

Using a BH viscometer at 4 rpm, each epoxy resin composition was measured for viscosity at 25° C. both immediately after preparation (initial) and after storage in a closed container at 25° C. for 7 days.

A flip chip having a silicon chip of 10×10×0.4 mm attached to a glass substrate via a solder bump with a chip-to-substrate spacing of 50 μm was encapsulated with each epoxy resin composition by molding at 80° C. for 30 minutes and curing at 120° C. for 4 hours. Space filling ability and lead-solder bump resistance were examined.

The resistance was measured both immediately after curing (initial) and after aging at 85° C. and RH 85% for 1,000 hours. It was evaluated Good and Poor when the resistance after 1,000 hour aging was less than and more than 140% relative to the initial resistance, respectively. The results are also shown in Table 4.

TABLE 4

|  | E1 | E2 | E3 | CE1 | CE2 | CE3 | CE4 | CE5 |
|---|---|---|---|---|---|---|---|---|
| Composition (pbw) |  |  |  |  |  |  |  |  |
| Epoxy resin | 75 | 50 | 70 | 95 | 77 | 75 | 75 | 38 |
| Silicone-modified epoxy resin I | 20 | 20 | 0 | 0 | 20 | 20 | 20 | 20 |
| II | 0 | 0 | 10 | 0 | 0 | 0 | 0 | 0 |
| Curing agent, Imidazole I | 5 | 0 | 0 | 5 | 0 | 5 | 5 | 0 |
| Imidazole II | 0 | 20 | 20 | 0 | 0 | 0 | 0 | 0 |
| Imidazole III | 0 | 0 | 0 | 0 | 3 | 0 | 0 | 0 |
| Acid anhydride IV | 0 | 0 | 0 | 0 | 0 | 0 | 0 | 42 |
| Fused silica I | 100 | 90 | 100 | 100 | 100 | 0 | 0 | 100 |
| II | 0 | 10 | 0 | 0 | 0 | 0 | 0 | 0 |
| III | 0 | 0 | 0 | 0 | 0 | 0 | 100 | 0 |
| Phenyl glycidyl ether | 0 | 10 | 0 | 0 | 0 | 0 | 0 | 0 |
| Ucat 5002 | 0 | 0 | 0 | 0 | 0 | 0 | 0 | 3 |
| γ-glycidoxytrimethoxysilane | 1 | 1 | 1 | 1 | 1 | 1 | 1 | 1 |
| Properties |  |  |  |  |  |  |  |  |
| Viscosity (poise), Initial | 2840 | 1300 | 2570 | 2700 | 3100 | 1160 | 2120 | 870 |
| 25° C./7 days | 3020 | 1380 | 2600 | 2800 | >4000 | 1160 | 2280 | 1240 |
| Filling ability | Good | Good | Good | Good | Poor | Good | Poor | Good |
| Resistance change | Good | Good | Good | Poor | Poor | Poor | Good | Poor |

As seen from Table 4, the compositions of the present invention can be kept stable during storage and show improved space filling ability and moisture resistance when applied for flip chip encapsulation.

There have been described compositions which have improved shelf stability and filling ability and cure into products having improved moisture resistance, satisfying the requirements for flip chip encapsulation. Semiconductor devices encapsulated with cured products of the compositions are fully resistant against moisture and remain reliable.

While the invention has been described in what is presently considered to be a preferred embodiment, other variations and modifications will become apparent to those skilled in the art. It is intended, therefore, that the invention not be limited to the illustrative embodiments, but be interpreted within the full spirit and scope of the appended claims.

We claim:
1. A flip chip encapsulating composition comprising
   (A) an epoxy resin having at least two epoxy groups in a molecule,
   (B) a silicone-modified epoxy resin in which an alkenyl-containing epoxy resin is modified with an organic silicon compound of formula (1):

$$H_a R_b SiO_{(4-a-b)/2} \tag{1}$$

wherein R is a substituted or unsubstituted monovalent hydrocarbon group or an alkoxy group, letters a and b are numbers meeting $0.01 \leq a \leq 1$ and $1 \leq b \leq 3$, in which the number of silicon atoms in a molecule is an integer of from 20 to 400, and the number of hydrogen atoms directly attached to silicon atoms is an integer of at least 1, (C) an imidazole compound having a solubility of up to 0.1% by weight in epoxy resin (A) at 25° C., and (D) fused silica having a mean particle size of up to 10 μm and containing up to 0.5% by weight of coarse particles having a particle size of at least 30 μm, said composition having a viscosity of up to about 4,000 poise at 25° C.

2. The composition of claim 1, wherein said composition comprises 100 parts by weight of component (A), about 0.5 to about 60 parts by weight of component (B), and about 0.5 to about 20 parts by weight of component (C).

3. The composition of claim 2, wherein said composition comprises about 30 to about 300 parts by weight of component (D) per 100 parts by weight of components (A), (B) and (C) combined.

4. The composition of claim 1, wherein said composition has a viscosity of about 100 to 2,000 poise at 25° C.

5. A semiconductor device encapsulated with a cured product of the composition of any one of claims 1 to 4.

6. The composition of claim 1, wherein said epoxy resin of component (A) is a glycidyl ether of bisphenol A or bisphenol F.

7. The composition of claim 1, wherein said imidazole compound of component (C) is selected from the group consisting of 2-phenyl-4,5-dihydroxymethylimidazole, 2-phenyl-4-methyl-5-hydroxymethylimidazole, 2,4-diamino-6[2'-undecylimidazolyl-(1)']ethyl-S-triazine, and 2-phenyl-4-benzyl-5-hydroxymethylimidazole.

* * * * *